US012604512B2

(12) United States Patent
Cai

(10) Patent No.: US 12,604,512 B2
(45) Date of Patent: Apr. 14, 2026

(54) TRENCH MOSFET AND MANUFACTURING METHOD THEREFOR

(71) Applicant: Silicon-Magic Semiconductor Technology (Hangzhou) Co., LTD., Hangzhou City (CN)

(72) Inventor: Jinyong Cai, Hangzhou City (CN)

(73) Assignee: SILICON-MAGIC SEMICONDUCTOR TECHNOLOGY (HANGZHOU) CO., LTD., Hangzhou City (CN)

( * ) Notice: Subject to any disclaimer, the term of this patent is extended or adjusted under 35 U.S.C. 154(b) by 404 days.

(21) Appl. No.: 18/477,258

(22) Filed: Sep. 28, 2023

(65) Prior Publication Data

US 2024/0105792 A1 Mar. 28, 2024

(30) Foreign Application Priority Data

Sep. 28, 2022 (CN) .......................... 202211188398.7

(51) Int. Cl.
| | |
|---|---|
| *H01L 29/423* | (2006.01) |
| *H01L 29/66* | (2006.01) |
| *H10D 30/01* | (2025.01) |
| *H10D 64/27* | (2025.01) |

(52) U.S. Cl.
CPC ......... *H10D 64/513* (2025.01); *H10D 30/021* (2025.01)

(58) Field of Classification Search
CPC ...... H10D 30/204; H10D 30/63; H10D 30/64; H10D 30/66; H10D 30/668; H10D 30/689; H10D 30/693; H10D 30/696; H10D 30/721; H10D 30/0289; H10D 30/025; H10D 30/0291; H10D 30/658; H10D 30/6734; H10D 64/111; H10D 64/00; H10D 64/117; H10D 64/513; H10D 64/512; H10D 64/2527; H10D 64/252; H10D 64/035; H10D 12/038; H10D 12/032; H10D 1/665; H10D 8/605; H10B 10/12
See application file for complete search history.

(56) References Cited

U.S. PATENT DOCUMENTS

| | | | | |
|---|---|---|---|---|
| 8,618,601 | B2 * | 12/2013 | Chen | H10D 30/025 |
| | | | | 257/330 |
| 9,419,129 | B2 * | 8/2016 | Gao | H10D 30/665 |
| RE46,311 | E * | 2/2017 | Kawaguchi | H10D 84/811 |
| 11,218,144 | B2 * | 1/2022 | Havanur | H10D 84/811 |

(Continued)

*Primary Examiner* — Lawrence C Tynes, Jr.
(74) *Attorney, Agent, or Firm* — Osha Bergman Watanabe & Burton LLP

(57) ABSTRACT

A method for manufacturing a MOSFET includes: forming a first trench and a second trench; forming a first shield gate dielectric layer and a first shielding conductor at a lower part of the first trench and a second shield gate dielectric layer and a second shielding conductor at a lower part of the second trench; forming a first dielectric interlayer and a second dielectric interlayer; forming a first gate dielectric layer and a first gate conductor at an upper part of the first trench and a second gate dielectric layer and a second gate conductor at an upper part of the second trench; and forming a body region, a source region, and a contact region. A dielectric constant of the second gate dielectric layer located in the second trench is greater than that of the first gate dielectric layer located in the first trench.

10 Claims, 12 Drawing Sheets

<u>100</u>

(56) References Cited

U.S. PATENT DOCUMENTS

| | | | | |
|---|---|---|---|---|
| 2012/0187474 A1* | 7/2012 | Rexer | ................. | H10D 64/117 |
| | | | | 438/270 |
| 2012/0319132 A1* | 12/2012 | Bhalla | ................. | H10D 30/668 |
| | | | | 438/173 |
| 2015/0295080 A1* | 10/2015 | Lee | ................... | H10D 64/2527 |
| | | | | 438/270 |
| 2016/0027915 A1* | 1/2016 | Kwon | ................... | H10D 84/83 |
| | | | | 257/334 |
| 2023/0307537 A1* | 9/2023 | Shiraishi | ........... | H10D 30/0297 |

* cited by examiner

TRENCH MOSFET AND MANUFACTURING METHOD THEREFOR

TECHNICAL FIELD

This application relates to the technical field of semiconductors, and in particular, to a trench metal-oxide-semiconductor field effect transistor (MOSFET) and a manufacturing method therefor.

BACKGROUND

Trench metal-oxide-semiconductor field effect transistors (MOSFET) are widely used in the field of power electronics by virtue of advantages such as a high input impedance, a low driving current, a high switching speed, and a desirable high-temperature characteristic.

In a conventional trench MOSFET, a source electrode is connected to a source region through a metal conductive channel, which forms a Schottky junction (a Schottky barrier rectifier) with a lower barrier to reduce a reverse recovery charge (Qrr) of the trench MOSFET. However, due to a large high temperature leakage of the Schottky junction during reverse continuation, use of the trench MOSFET is limited.

SUMMARY

According to one or more embodiments of the present disclosure, a method for manufacturing a trench metal-oxide-semiconductor field effect transistor (MOSFET) comprises: forming a first trench and a second trench extending from an upper surface of an epitaxial layer of a first dopant type into the epitaxial layer, wherein the epitaxial layer comprises a first region and a second region, the first trench is located in the first region, and the second trench is located in the second region; forming a first shield gate dielectric layer and a first shielding conductor at a lower part of the first trench and a second shield gate dielectric layer and a second shielding conductor at a lower part of the second trench; forming a first dielectric interlayer on surfaces of the first shield gate dielectric layer and the first shielding conductor and a second dielectric interlayer on surfaces of the second shield gate dielectric layer and the second shielding conductor; forming a first gate dielectric layer and a first gate conductor at an upper part of the first trench and a second gate dielectric layer and a second gate conductor at an upper part of the second trench; and forming a body region, a source region, and a contact region on two adjacent sides in the epitaxial layer adjacent to the first trench and the second trench, wherein the source region is of the first dopant type, and the body region and the contact region are of a second dopant type; and a dielectric constant of the second gate dielectric layer located in the second trench is greater than that of the first gate dielectric layer located in the first trench.

According to one or more embodiments of the present disclosure, a trench metal-oxide-semiconductor field effect transistor (MOSFET) comprises: an epitaxial layer of a first dopant type; a first trench, extending from an upper surface of the epitaxial layer into the epitaxial layer; a first shield gate dielectric layer, arranged at a lower part of the first trench and covering an inner surface of the lower part of the first trench; a first shielding conductor, arranged at the lower part of the first trench and separated from the epitaxial layer by the first shield gate dielectric layer; a first dielectric interlayer, arranged on a surface of the first shield gate dielectric layer; a first gate dielectric layer, arranged at an upper part of the first trench and covering an inner surface of the upper part of the first trench; a first gate conductor, arranged at the upper part of the first trench and separated from the epitaxial layer by the first gate dielectric layer; a second trench, extending from the upper surface of the epitaxial layer into the epitaxial layer; a second shield gate dielectric layer, arranged at a lower part of the second trench and covering an inner surface of the lower part of the second trench; a second shielding conductor, arranged at the lower part of the second trench and separated from the epitaxial layer by the second shield gate dielectric layer; a second dielectric interlayer, arranged on a surface of the second shield gate dielectric layer; a second gate dielectric layer, arranged at an upper part of the second trench and covering an inner surface of the upper part of the second trench; a second gate conductor, arranged at the upper part of the first trench and separated from the epitaxial layer by the second gate dielectric layer; a body region, a source region, and a contact region, located on two sides in the epitaxial layer adjacent to the first trench and the second trench, wherein the source region is of the first dopant type, and the body region and the contact region are of a second dopant type; and a dielectric constant of the second gate dielectric layer located in the second trench is greater than that of the first gate dielectric layer located in the first trench.

BRIEF DESCRIPTION OF THE DRAWINGS

The above and other purposes, features, and advantages of this application will be clearer through the following description of embodiments of this application with reference to the drawings, in which.

DETAILED DESCRIPTION

Figure 1:
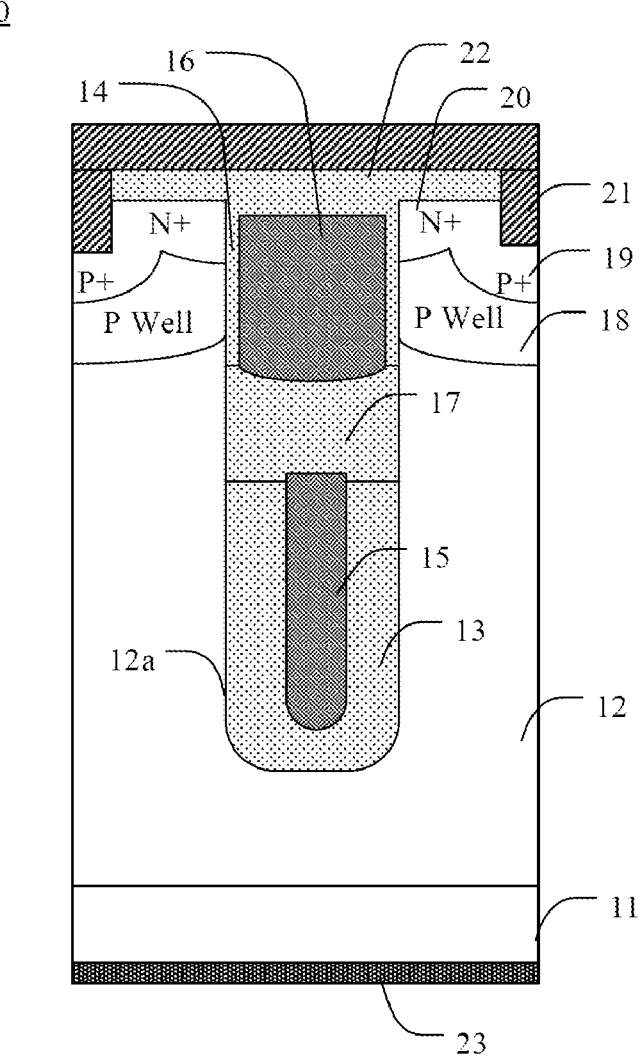
FIG. 1 is a sectional view of a trench metal-oxide-semiconductor field effect transistor (MOSFET)

The present disclosure will be described in more detail below with reference to the accompanying drawings. In each accompanying drawing, the same elements are denoted by the similar reference numerals. For the sake of clarity, each part in the accompanying drawings is not drawn to scale. In addition, some well-known parts may not be shown. For the sake of simplicity, a semiconductor structure obtained after several steps may be described in a drawing.

It should be understood that, during the description of the structure of a device, when a layer or region is referred to as being located "on" or "above" another layer or region, it may be directly located on another layer or region, or other layers or regions are also included between it and another layer or region. Moreover, if the device is turned over, the layer or region will be located "under" or "below" another layer or region.

In order to describe the situation of being directly located on another layer or region, the expression "directly on . . . " or "on and adjacent to . . . " will be adopted herein.

The specific implementation of the present disclosure will be further described in detail below with reference to the accompanying drawings and the embodiments.

As shown in FIG. 1, a trench metal-oxide-semiconductor field effect transistor (MOSFET) 10 includes a semiconductor substrate 11 of a first conduction type. An epitaxial layer 12 is arranged on an upper surface of the semiconductor substrate 11, and a metal layer 23 is formed on a rear surface of the semiconductor substrate 11. The epitaxial layer 12 has a trench 12a, and a side wall of the trench 12a is covered with a first dielectric layer 13 and a second dielectric layer 14. The trench 12a has a first conductor 15 and a second conductor 16. The first conductor 15 is located at a lower half of the trench, the second conductor 16 is located at an upper half of the trench, and an dielectric interlayer 17 is arranged between the first conductor 15 and the second conductor 16. The first conductor 15 is separated from the epitaxial layer 12 by the first dielectric layer 13, and the second conductor 16 is separated from the epitaxial layer 12 by the second dielectric layer 14.

A body region 18 of a second conduction type is arranged in the epitaxial layer 12, and a heavily doped region 19 of the second conduction type is arranged in the body region 18. The second conductor 16 is separated from the body region 18 by the second dielectric layer 14. A heavily doped source region 20 of the first conduction type is arranged in the body region 18, and a conductive channel 21 is arranged in the source region 20 and the heavily doped region 19. The conductive channel 21 and the second conductor 16 are separated from each other by a fourth dielectric layer 22. The conductive channel 21 forms a Schottky junction (a Schottky barrier rectifier) with a lower barrier in the source region 20 to reduce a reverse recovery charge (Qrr) of the trench MOSFET.

Figure 2:
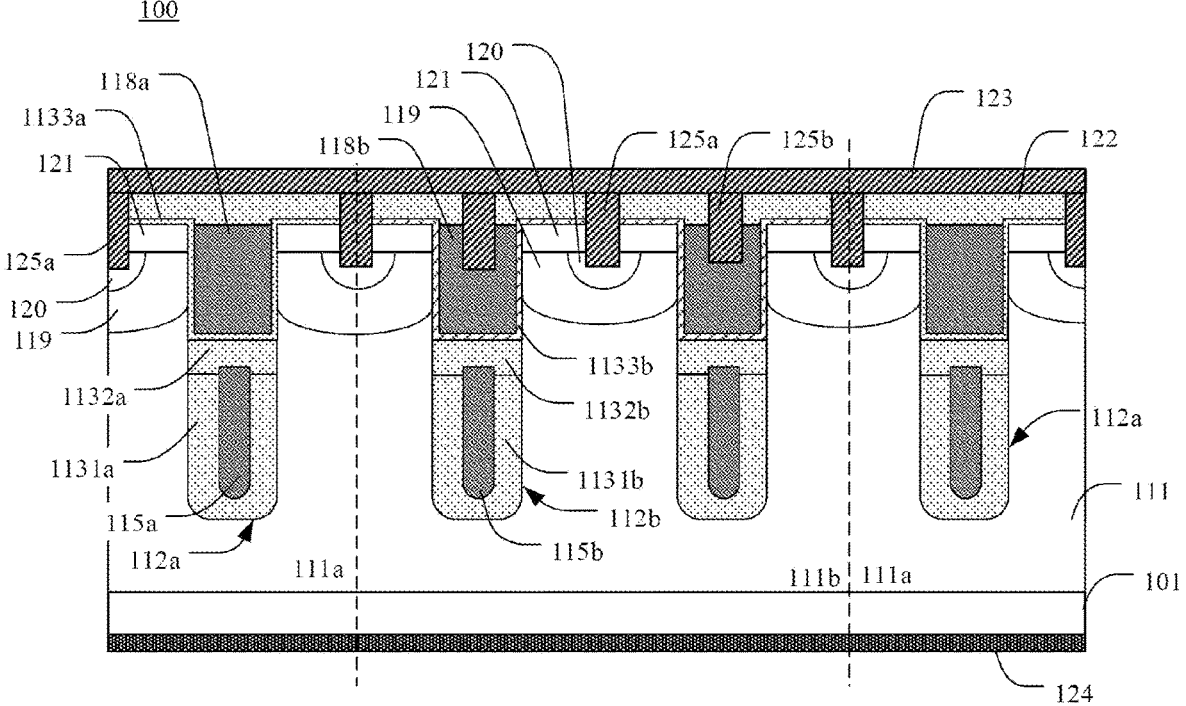
FIG. 2 is a sectional view of a trench MOSFET according to one or more embodiments of this application.

FIG. 2 is a sectional view of a trench MOSFET according to one or more embodiments of this application. In the present disclosure, the first dopant type is one of an N type and a P type, and the second dopant type is the other of the N type and the P type. An N-type semiconductor layer may be formed by implanting an N-type dopant such as P and As into the semiconductor layer. A P-type semiconductor layer may be formed by adding a P-type dopant such as B into the semiconductor layer.

The trench MOSFET 100 includes a substrate 101 and an epitaxial layer 111 located on the substrate. The substrate 101 is of the first dopant type. In one or more embodiments, the substrate 101 is of the first dopant type (for example, heavily doped N-type). The epitaxial layer 111 is located on a first surface of the substrate 101. The epitaxial layer 111 is of the first dopant type, which is lightly doped compared with that of the substrate 101. A drain electrode 124 is formed on a second surface of the substrate 101.

The epitaxial layer 111 includes a first region 111a and a second region 111b. A power MOSFET structure is formed in the first region 111a, and a super barrier rectifier (SBR) structure is formed in the second region 111b.

The first region 111a is provided with a first trench 112a extending from an upper surface of the epitaxial layer 111 into the epitaxial layer 111, and a dielectric layer and an electrode conductor are located inside the first trench 112a.

The dielectric layer in the first trench 112a includes a first shield gate dielectric layer 1131a, a first gate dielectric layer 1133a, and a first dielectric interlayer 1132a. The electrode conductor includes a first shielding conductor 115a and a first gate conductor 118a. The first shield gate dielectric layer 1131a covers an inner surface of a lower part of the first trench 112a, and the first shielding conductor 115a is located in a cavity formed by the first shield gate dielectric layer 1131a around the lower part of the first trench 112a. The first gate dielectric layer 1133a covers an inner surface of an upper part of the first trench 112a, the first gate conductor 118a is located in a cavity formed by the first gate dielectric layer 1133a around the inner surface of the upper part of the first trench 112a, and a side wall of the first gate conductor 118a is separated from the epitaxial layer 111 by the first gate dielectric layer 1133a. The first dielectric interlayer 1132a is located between the first shielding conductor 115a and the first gate conductor 118a, which separates the first shielding conductor 115a from the first gate conductor 118a.

The second region 111b is provided with a second trench 112b extending from the upper surface of the epitaxial layer 111 into the epitaxial layer, a dielectric layer and an electrode conductor located inside the second trench 112b, and a body region 119 located in the epitaxial layer 111 and adjacent to the second trench 112b. The body region 119 is of the second dopant type.

The dielectric layer in the second trench 112b includes a second shield gate dielectric layer 1131b, a second gate dielectric layer 1133b, and a second dielectric interlayer 1132b. The electrode conductor includes a second shielding conductor 115b and a second gate conductor 118b. The second shield gate dielectric layer 1131b covers an inner surface of a lower part of the second trench 112b, and the second shielding conductor 115b is located in a cavity formed by the second shield gate dielectric layer 1131b around the inner surface of the lower part of the second trench 112b. The second gate dielectric layer 1133b covers an inner surface of an upper part of the second trench 112b, the second gate conductor 118b is located in a cavity formed by the second gate dielectric layer 1133b around the inner surface of the upper part of the second trench 112b, and the second gate conductor 118b is separated from the epitaxial layer 111 by the second gate dielectric layer 1133b. The second dielectric interlayer 1132b is located between the second shielding conductor 115b and the second gate conductor 118b, which separates the second shielding conductor 115b from the second gate conductor 118b.

The trench MOSFET 100 further includes a body region 119 of the second dopant type. A source region 121 of the first dopant type is formed in the body region 119. A contact region 120 of the second dopant type is formed in the body region 119. A dielectric interlayer 122 is formed above the source region 121, the first gate conductor 118a, and the second gate conductor 118b. A first conductive channel 125a extends to the contact region 120 through the dielectric interlayer 122 and the source region 121, and is formed close to the source region 121. A second conductive channel 125b extends into the second gate conductor 118b through the dielectric interlayer 122, and is formed above the second gate conductor 118b. A source electrode 123 is formed above the dielectric interlayer 122. The source electrode 123 is connected to the contact region 120 through the first conductive channel 125a and is connected to the second gate conductor 118b through the second conductive channel 125b.

In the first region 111a, the power MOSFET structure is formed by the first trench 112a, the first shield gate dielectric layer 1131a, the first gate dielectric layer 1133a, the first dielectric interlayer 1132a, the first shielding conductor 115a, the first gate conductor 118a, together with the body region 119, the source region 121, and the contact region 120 within the first region 111a. In the second region 111b, the SBR structure is formed by the second trench 112b, the second shield gate dielectric layer 1131b, the second gate dielectric layer 1133b, the second dielectric interlayer 1132b, the second shielding conductor 115b, the second gate conductor 118b, together with the body region 119, the source region 121, and the contact region 120 within the second region 1/1b.

A dielectric constant of the second gate dielectric layer 1133b located in the second trench 112b is greater than that of the first gate dielectric layer 1133a located in the first trench 112a. In one or more embodiments, the first gate dielectric layer 1133a is an oxide layer, such as a silicon oxide layer; the second gate dielectric layer 1133b is a nitride layer, such as a silicon nitride layer, but not limited herein.

In one or more embodiments, the SBR structure is integrated in the trench MOSFET, and the SBR structure comprises a gate dielectric layer with a larger dielectric constant. During reverse continuation, in the power MOSFET structure within the first region 111a, a low barrier channel is formed by the first conductive channel 125a, the contact region 120, the body region 119, and the epitaxial layer 111. In the SBR structure within the second region 111b, a plurality of low-barrier sub-channels are formed by the source region 121, the contact region 120, the body region 119, and the epitaxial layer 111, which effectively reduces Qrr compared with a conventional trench MOSFET.

In one or more embodiments, by increasing the dielectric constant of the gate dielectric layer of the SBR structure and increasing a thickness of the gate dielectric layer of the SBR structure, the electric leakage of the gate dielectric layer of the SBR structure is effectively reduced.

Since the SBR structure adopts the gate dielectric layer with a larger dielectric constant, the SBR structure have a stronger control ability for the trench, which not only ensures that the SBR structure has a low Vf (a voltage drop of a parasitic diode), but also enables the SBR structure and the power MOSFET structure to use the same body region, thereby avoiding a large Idss leakage of the common SBR structure.

FIG. 3A to FIG. 3G are sectional views of all stages of a method for manufacturing a trench MOSFET device according to one or more embodiments of the present disclosure.

Figure 3A:
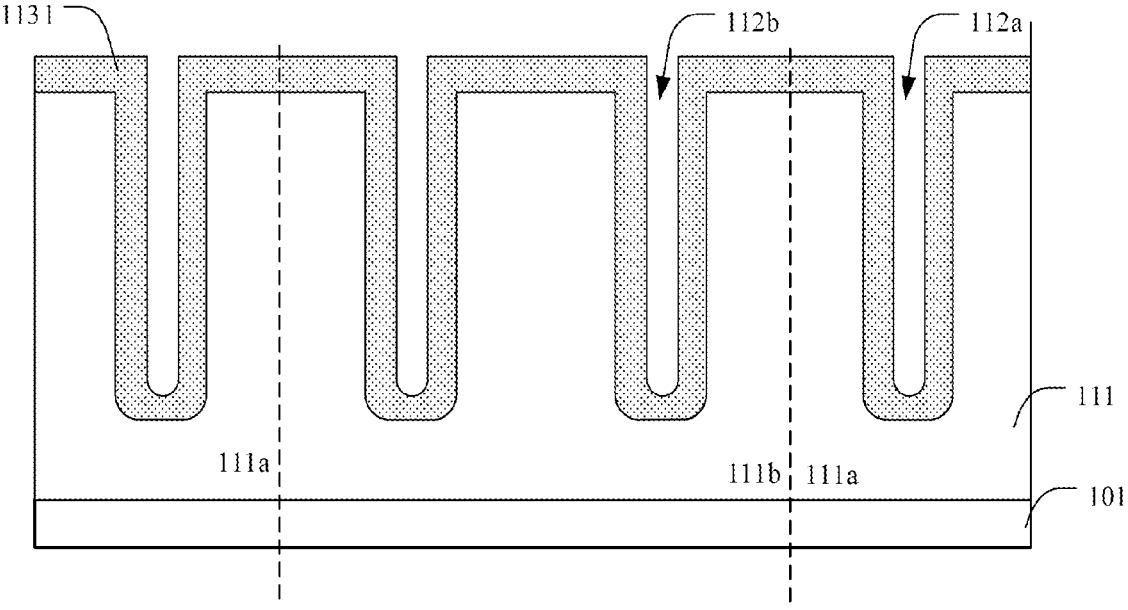
FIG. 3A to FIG. 3J are sectional views of all stages of a method for manufacturing a trench MOSFET device according to one or more embodiments of this application.

As shown in FIG. 3A, an epitaxial layer 111 is formed on a substrate 101, a first trench 112a is formed in a first region 111a of the epitaxial layer 111, and a second trench 112b is formed in a second region 111b of the epitaxial layer 111.

In this step, the epitaxial layer 111 is formed on the substrate 101, and the substrate 101 is used as a drain region of the final device and has a first dopant type. In one or more embodiments, the substrate 101 may be a monocrystalline silicon substrate doped into an N type. The epitaxial layer 111 includes the first region 111a and the second region 111b.

A patterned first mask is formed on a first surface of the epitaxial layer 111. The first trench 112a is formed in the first region 111a of the epitaxial layer 111, and the second trench 112b is formed in the second region 111b of the epitaxial layer 111 through the patterned first mask.

In this step, for example, the mask layer is formed by a deposition process. The patterned first mask including openings of the first trench 112a and the second trench 112b is formed by photolithography, and then the epitaxial layer 111 exposed from the first mask is etched to form the first trench 112a in the first region 111a of the epitaxial layer 111 and the second trench 112b in the second region 111b. In one or more embodiments, the etching may be dry etching, such as ion milling etching, plasma etching, reactive ion etching, and laser ablation, or may be wet etching. In one or more embodiments, the first mask may be a photoresist mask.

After the first trench 112a and the second trench 112b are formed, the first mask is removed.

In one or more embodiments, a shield gate dielectric layer 1131 is formed inside the first trench 112a, inside the second trench 112b and on an upper surface of the epitaxial layer 111 by thermal oxidation or chemical vapor deposition. That is to say, the shield gate dielectric layer 1131 covers a bottom and side walls of the first trench 112a, a bottom and side walls of the second trench 112b, and the upper surface of the epitaxial layer 111.

In one or more embodiments, the shield gate dielectric layer 1131 may be composed of oxide or nitride, for example, silicon oxide or silicon nitride. Thermal oxidation includes hydrothermal oxidation HTO or selective reactive oxidation SRO (Selective Reactive Oxidation), chemical vapor deposition CVD includes low pressure chemical vapor deposition LPCVD or subatmospheric pressure chemical vapor deposition SACVD.

Figure 3B:
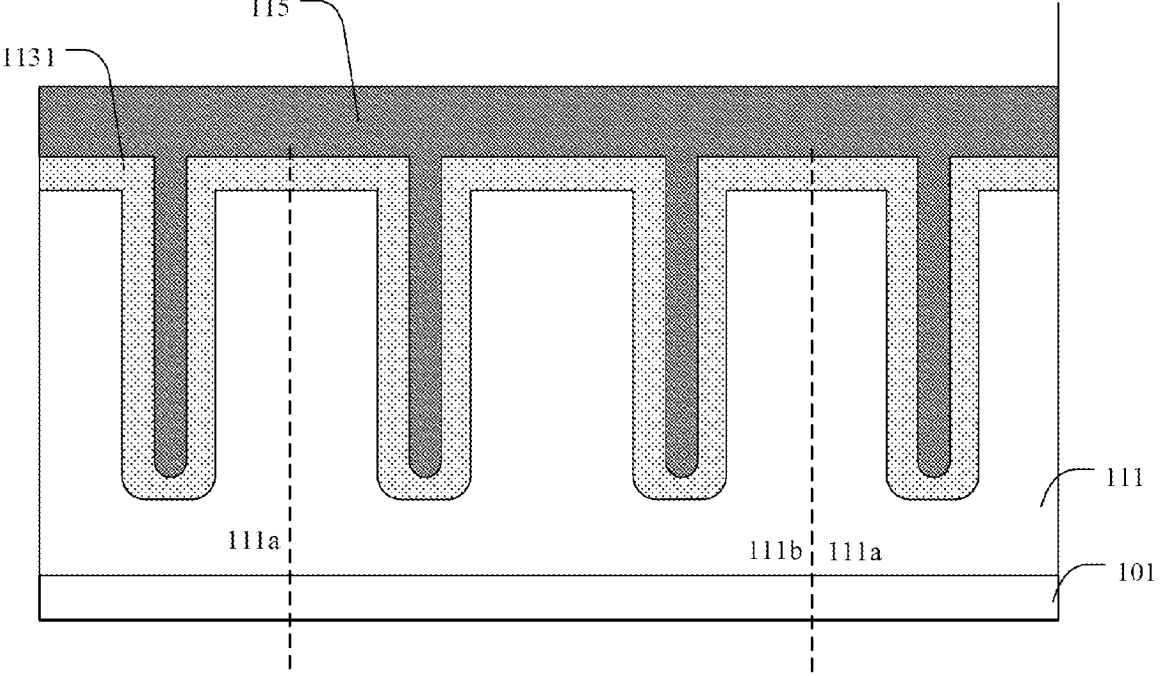

As shown in FIG. 3B, a polysilicon layer 115 is formed inside the first trench 112a, inside the second trench 112b, and on the upper surface of the epitaxial layer 111.

In this step, the polysilicon layer 115 is formed inside of the first trench 112a, inside the second trench 112b and on the upper surface of the epitaxial layer 111 by low-pressure chemical vapor deposition. The shield gate dielectric layer 1131 separates the polysilicon layer 115 from the epitaxial layer 111.

Figure 3C:
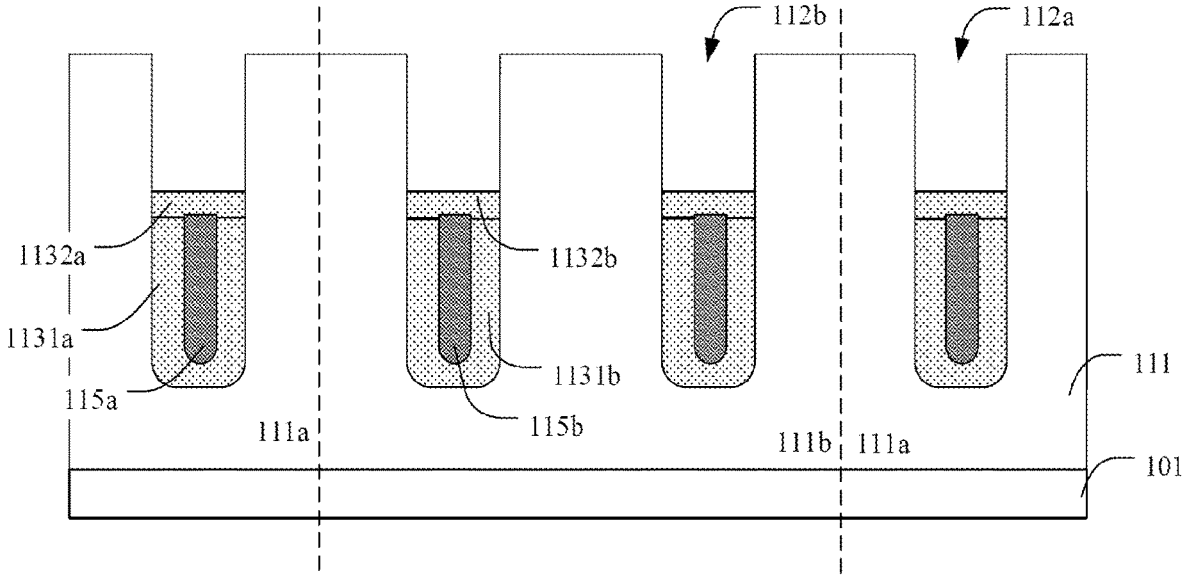

As shown in FIG. 3C, the shield gate dielectric layer and the polysilicon layer are etched back.

In this step, chemical mechanical grinding is performed on the polysilicon layer and the polysilicon is etched back to remove the polysilicon layer on the upper surface of epitaxial layer 111, an upper part of the first trench 112a, and an upper part of the second trench 112b. The remaining polysilicon layer in the first trench 112a forms a first shielding conductor 115a, that is, the first shielding conductor 115a is located at the lower part of the first trench 112a, and the remaining polysilicon layer in the second trench 112b forms a second shielding conductor 115b, that is, the second shielding conductor 115b is located at the lower part of the second trench 112b. In one or more embodiments, dry etching may be used for etching back.

The shield gate dielectric layer is etched to remove the shield gate dielectric layer located on the upper surface of the epitaxial layer 111, the upper part of the first trench 112a, and the upper part of the second trench 112b, so that in the first region 111a, the first shield gate dielectric layer 1131a is located between a side wall of the first trench 112a and the first shielding conductor 115a, and the first shield gate dielectric layer 1131a exposes a top of the first shielding conductor 115a, and in the second region 111b, the second shield gate dielectric layer 1131b is located between a side wall of the second trench 112b, and the second shielding conductor 115b and the second shield gate dielectric layer 1131b exposes a top of the second shielding conductor 115b. In the first trench 112a, a surface of the first shield gate dielectric layer 1131a is lower than a surface of the first shielding conductor 115a, and in the second trench 112, a surface of the second shield gate dielectric layer 1131b is lower than a surface of the second shielding conductor 115b.

In one or more embodiments, the etching process may be wet etching to carve a relatively flat film surface into a textured surface to increase an optical path and reduce light reflection. A diluted HF or buffered oxide etch (BOE) or the like may be used for the wet etching.

A conformal dielectric interlayer is formed on the top of the first shielding conductor 115a and a top of the first shield gate dielectric layer 1131*a* in the first trench 112*a* and on the top of the second shielding conductor 115*b* and a top of the second shield gate dielectric layer 1131*b* in the second trench 112*b* by a plasma enhanced chemical vapor deposition method. The dielectric interlayer covers the top of the first shielding conductor 115*a* and the top of the first shield gate dielectric layer 1131*a* in the first trench 112*a* and covers the top of the second shielding conductor 115*b* and the top of the second shield gate dielectric layer 1131*b* in the second trench 112*b*; and is located on a side wall of the upper part of the first trench 112*a*, a side wall of the upper part of the second trench 112*b*, and the upper surface of the epitaxial layer 111. The dielectric interlayer may be composed of oxides or nitrides, such as silicon oxide or silicon nitride.

The dielectric interlayer on the upper surface of the epitaxial layer 111 is removed by a chemical mechanical grinding process, and then the dielectric interlayer in the first trench 112*a* is etched back with a BOE solution, to reserve a first dielectric interlayer 1132*a* with a specific thickness on the top of the first shield gate dielectric layer 1131*a* and the top of the first shielding conductor 115*a* in the first trench 112*a*. The dielectric interlayer in the second trench 112*b* is etched back with the BOE solution, to reserve a second dielectric interlayer 1132*b* with a specific thickness on the top of the second shield gate dielectric layer 1131*b* and the top of the second shielding conductor 115*b* in the second trench 112*b*.

Figure 3D:
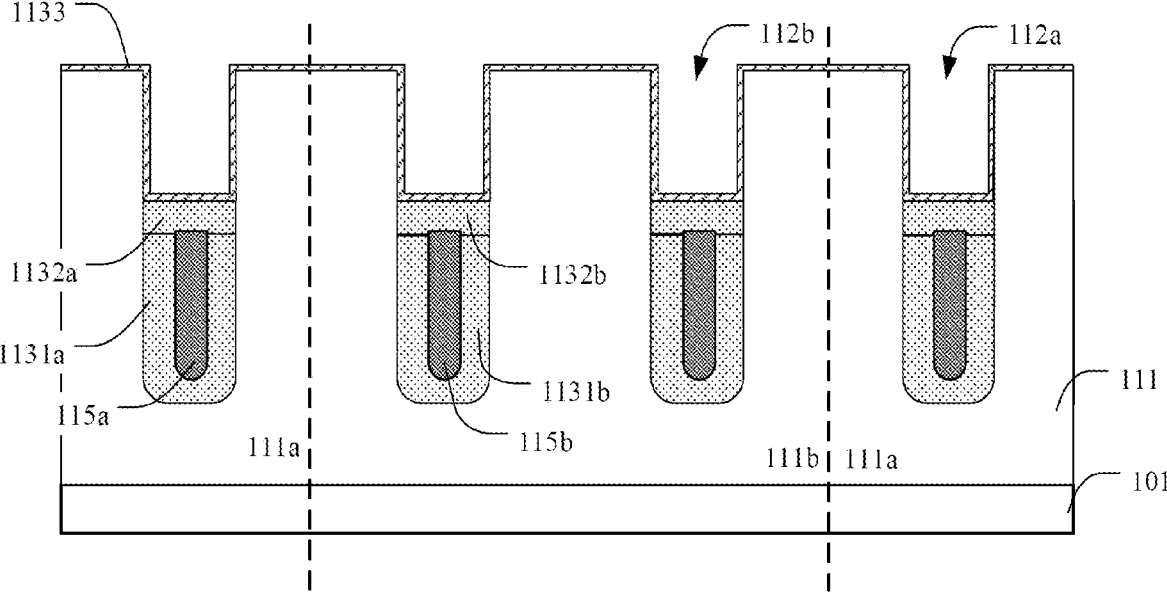

As shown in FIG. 3D, a first dielectric layer 1133 is formed.

In this step, the first dielectric layer 1133 is formed on a surface of the first dielectric interlayer 1132*a* in the first trench 112*a*, the side wall of the upper part of the first trench 112*a*, a surface of the second dielectric interlayer 1132*b* in the second trench 112*b*, the side wall of the upper part of the second trench 112*b*, and the upper surface of the epitaxial layer 111. The first dielectric layer 1133 is a high-k dielectric layer, such as a nitride layer, for example, a silicon nitride layer.

Figure 3E:
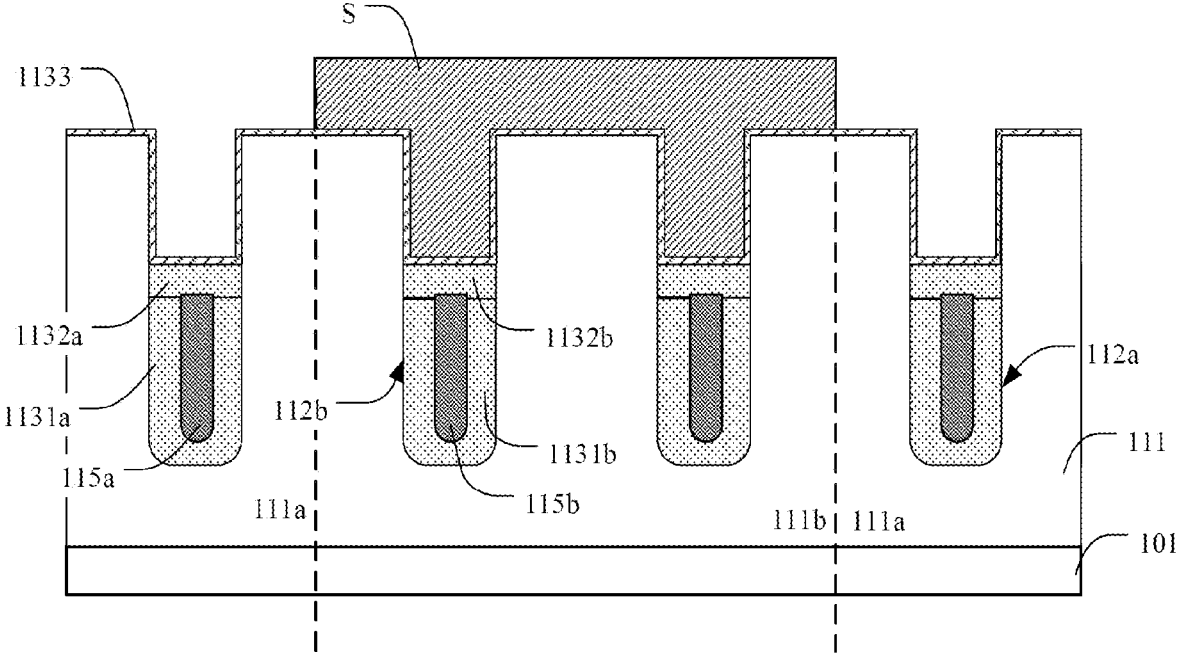

As shown in FIG. 3E, a second mask S is formed.

In this step, for example, a mask layer is formed on a surface of the first dielectric layer 1133 through a deposition process. The second mask S is formed on the surface of the first dielectric layer 1133 in the second region 111*b* by photolithography, that is, the second mask S covers the surface of the first dielectric layer 1133 in the second region 111*b* and exposes the surface of the first dielectric layer 1133 in the first region 111*a*.

Figure 3F:
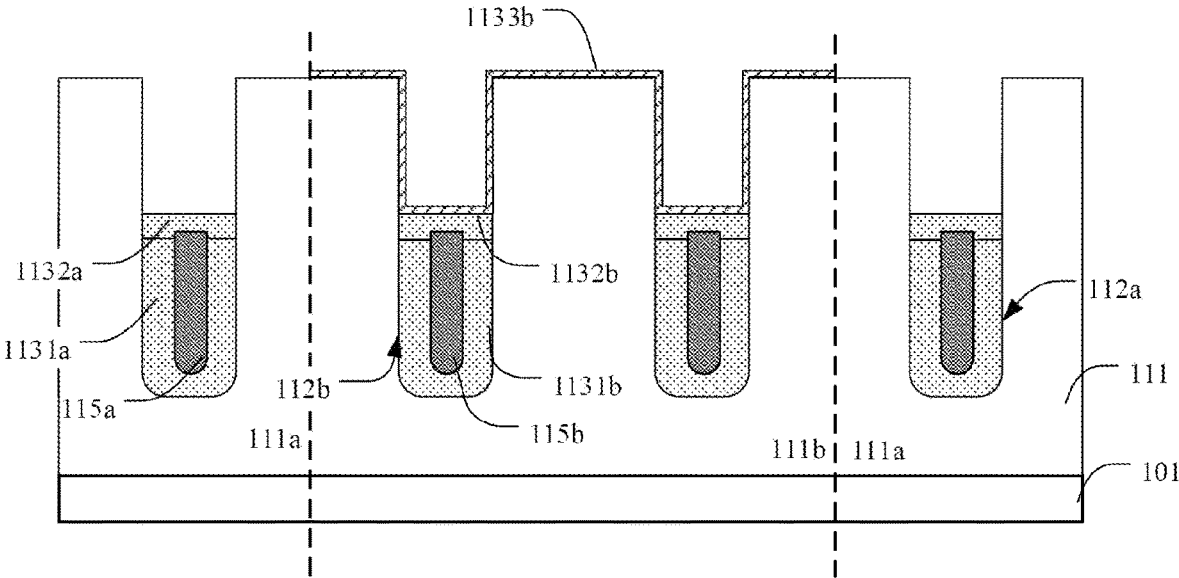

As shown in FIG. 3F, the first dielectric layer 1133 in the first region 111*a* is removed to form a second gate dielectric layer 1133*b*.

In this step, the first dielectric layer 1133 in the first region 111*a* of the epitaxial layer 111 is etched by shielding of the second mask S, to remove the first dielectric layer 1133 in the first region 111*a* of the epitaxial layer 111, and the remaining first dielectric layer 1133 in the second region 111*b* forms the second gate dielectric layer 1133*b*.

In one or more embodiments, the first dielectric layer 1133 in the first region 111*a* is etched with the BOE solution. In one or more embodiments, the second mask S may be a photoresist mask. After the first dielectric layer 1133 in the first region 111*a* is removed, the second mask S is removed.

Figure 3G:
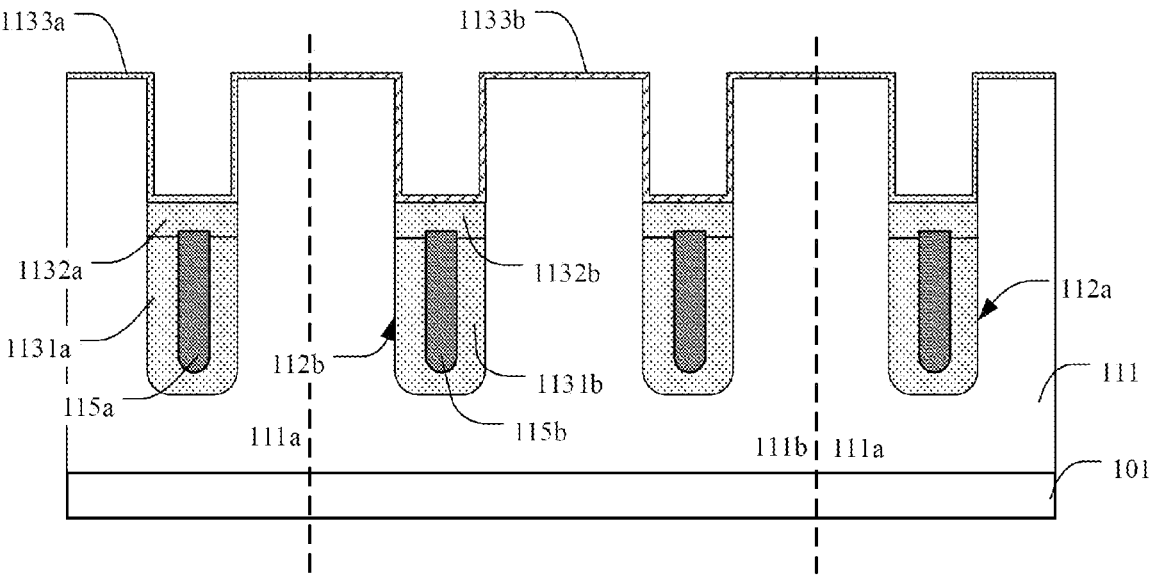

As shown in FIG. 3G, a first gate dielectric layer 1133*a* is formed in the first region 111*a* of the epitaxial layer 111.

In this step, for example, an oxide layer, that is, the first gate dielectric layer 1133*a* is formed on the side wall of the upper part of the first trench 112*a* and the surface of the epitaxial layer 111 in the first region 111*a* by a thermal oxidation technology. The first gate dielectric layer 1133*a* covers the side wall of the upper part of the first trench 112*a* and the surface of the epitaxial layer 111 in the first region 111*a*. The thermal oxidation technology generally means carrying out a chemical reaction between silicon and gases containing oxidizing substances, such as water vapor and oxygen at a high temperature to form a dense silicon dioxide ($SiO_2$) film on a surface of a silicon wafer.

Figure 3H:
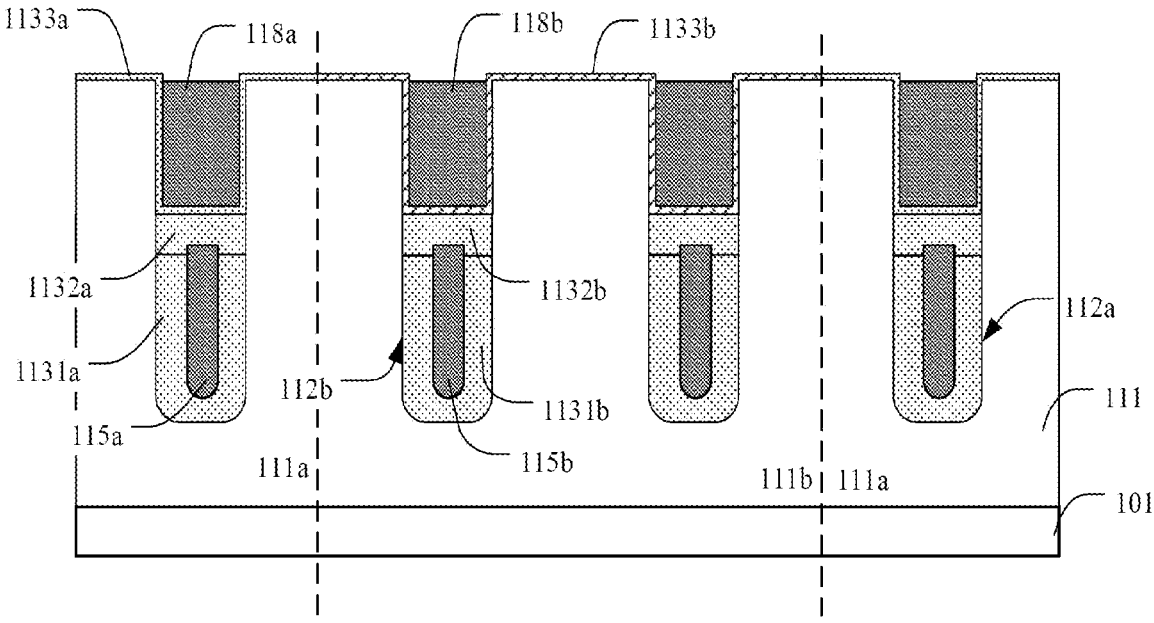

As shown in FIG. 3H, a polysilicon layer is filled in the first trench 112*a* covered with the first gate dielectric layer 1133*a* and the second trench 112*b* covered with the second gate dielectric layer 1133*b* by low-pressure chemical vapor deposition. The polysilicon layer extends to a position on the epitaxial layer 111. The polysilicon layer on the epitaxial layer 111 is removed by etch back or chemical mechanical grinding to form the first gate conductor 118*a* in the first trench 112*a* and the second gate conductor 118*b* in the second trench 112*b*. The upper surfaces of the first gate conductor 118*a* and the second gate conductor 118*b* are flush with the surface of the epitaxial layer 111 or slightly lower than the surface of the epitaxial layer 111.

Figure 3I:
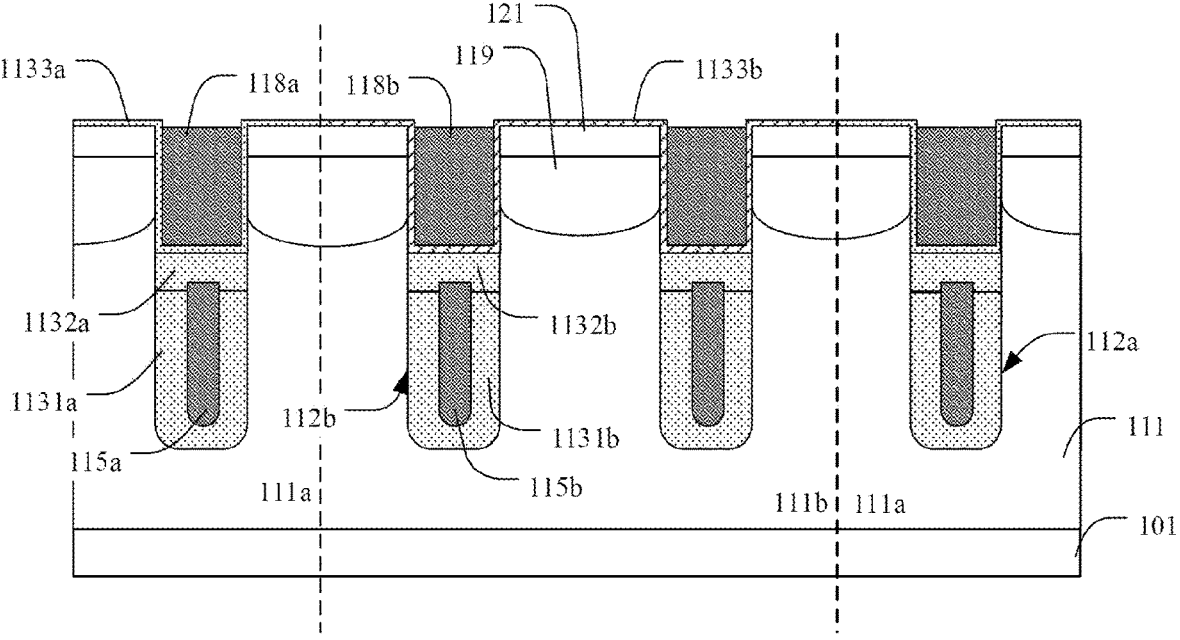

As shown in FIG. 3I, a body region 119 adjacent to the first trench 112*a* and the second trench 112*b* is formed, and the body region 119 is of a second dopant type. The second dopant type is opposite to the first dopant type.

A first ion implantation is performed by using the body implantation and drive-in technique, and the body region 119 is formed in a region in the first region 111*a* adjacent to the first trench 112*a* and a region in the second region 111*b* adjacent to the second trench 112*b*.

A second ion implantation is performed to form a source region 121 of the first dopant type in the body region 119. By controlling parameters of the ion implantation, such as an implantation energy and an implantation dose, a required depth and a required doping concentration can be achieved.

In the first region 111*a*, a depth of the body region 119 does not exceed an extension depth of the first gate conductor 118*a* in the first trench 112*a*. The body region 119 and the source region 121 are adjacent to the first trench 112*a*. The body region 119 and source region 121 are separated from the first gate conductor 118*a* by the first gate dielectric layer 1133*a*. In the second region 111*b*, a depth of the body region 119 does not exceed an extension depth of the second gate conductor 118*b* in the second trench 112*b*, and the body region 119 and the source region 121 are adjacent to the second trench 112*b*. The body region 119 and the source region 121 are separated from the second gate conductor 118*b* by the second gate dielectric layer 1133*b*.

Figure 3J:
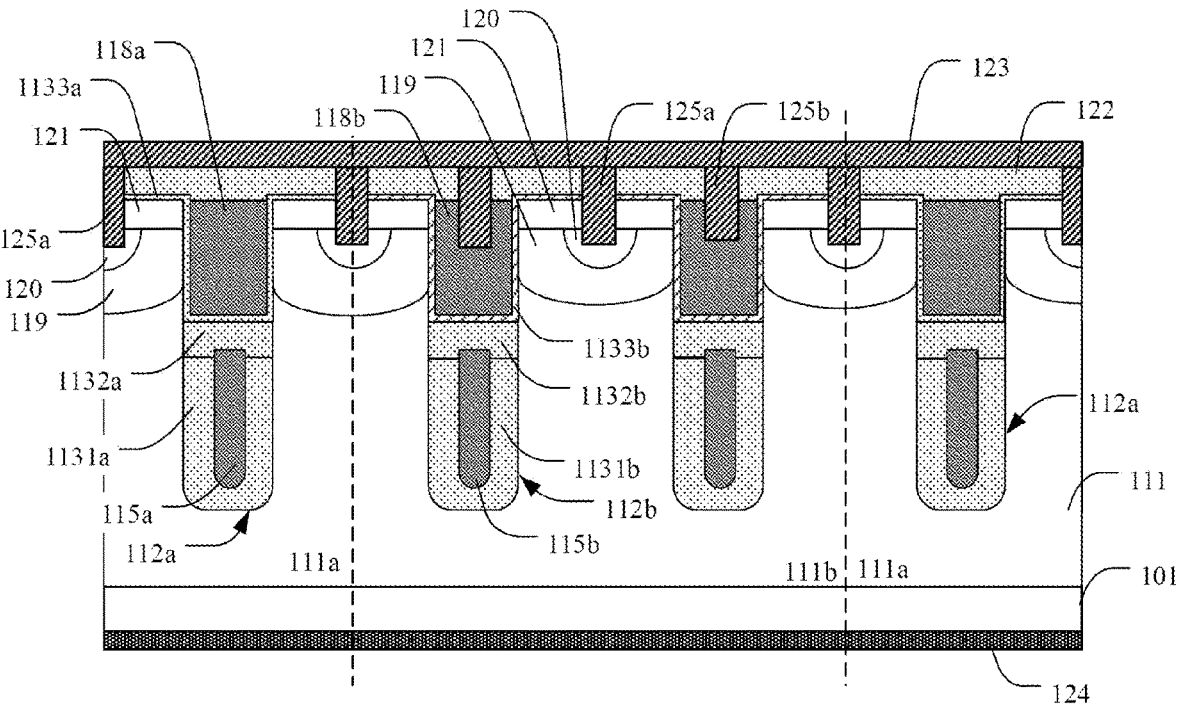

As shown in FIG. 3J, a dielectric interlayer 122 is formed above the source region 121 by the deposition process, which may be further chemically and mechanically ground to obtain a flat surface. The dielectric interlayer 122 covers top surfaces of the source region 121, the first gate conductor 118*a*, and the second gate conductor 118*b*. A part of the first gate dielectric layer 1133*a* in the first region 111*a* located on the upper surface of the epitaxial layer 111 and a part of the second gate dielectric layer 1133*b* in the second region 111*b* located on the upper surface of the epitaxial layer 111 may be removed through etching or not be removed after the source region 121 is formed, which is conformal with the dielectric interlayer 122 and located above the source region 121.

A contact region 120 of the second dopant type is formed in the body region 119 by the etching process and the ion implantation process. By the etching process, a first conductive channel 125*a* extending through the dielectric interlayer 122 and the source region 121 to the contact region 120 is formed in the first region 111a and the second region 111b and between the first region 111a and the second region 111b; and a second conductive channel 125b extending through the dielectric interlayer 122 into the second gate conductor 118b is formed in the second region 111b.

A source electrode 123 is formed on the dielectric interlayer 122. The source electrode 123 is connected to the contact region 120 through the first conductive channel 125a and to the second gate conductor 118b through the second conductive channel 125b.

By the deposition process, a drain electrode 124 is formed on a second surface of the substrate 101.

In the present disclosure, the source electrode 123, the first gate conductor 118a, the second gate conductor 118b, the first shielding conductor 115a, the second shielding conductor 115b, and the drain electrode 124 can be manufactured using conductive materials respectively. In one or more embodiments, it can be metal materials such as aluminum alloy or copper.

The embodiments in accordance with the present disclosure, as described above, neither describe all details thoroughly nor limit the present disclosure, and are only the specific embodiments. Apparently, many modifications and variations are possible in light of the above description. These embodiments are selected and specifically described in this description to better explain the principle and practical application of the present disclosure, so that those skilled in the art may make good use of the present disclosure and modifications based on the present disclosure. The present disclosure is to be limited only by the claims and their full scope and equivalents.

What is claimed is:

1. A method for manufacturing a trench metal-oxide-semiconductor field effect transistor (MOSFET), comprising:

forming a first trench and a second trench extending from an upper surface of an epitaxial layer of a first dopant type into the epitaxial layer, wherein the epitaxial layer comprises a first region and a second region, the first trench is located in the first region, and the second trench is located in the second region;

forming a first shield gate dielectric layer and a first shielding conductor at a lower part of the first trench and a second shield gate dielectric layer and a second shielding conductor at a lower part of the second trench;

forming a first dielectric interlayer on surfaces of the first shield gate dielectric layer and the first shielding conductor and a second dielectric interlayer on surfaces of the second shield gate dielectric layer and the second shielding conductor;

forming a first gate dielectric layer and a first gate conductor at an upper part of the first trench and a second gate dielectric layer and a second gate conductor at an upper part of the second trench;

forming a body region, a source region, and a contact region on two adjacent sides in the epitaxial layer adjacent to the first trench and the second trench, wherein the source region is of the first dopant type, and the body region and the contact region are of a second dopant type; and a dielectric constant of the second gate dielectric layer located in the second trench is greater than that of the first gate dielectric layer located in the first trench.

2. The method according to claim 1, wherein forming the second gate dielectric layer comprises:

forming a first dielectric layer covering a surface of the first dielectric interlayer in the first trench, a side wall of the first trench, a surface of the second dielectric interlayer in the second trench, a side wall of the second trench, and an upper surface of the epitaxial layer;

forming a mask, wherein the mask covers the surface of the second dielectric interlayer in the second trench, the side wall of the second trench, and a surface of the epitaxial layer in the second region; and removing the first dielectric layer on the surface of the first dielectric interlayer in the first trench, on the side wall of the first trench, and on the surface of the epitaxial layer in the first region through the mask.

3. The method according to claim 2, wherein after the second gate dielectric layer is formed, the side wall at the upper part of the first trench and the surface of the epitaxial layer in the first region are oxidized to form the first gate dielectric layer.

4. The method according to claim 1, wherein after the source region is formed, the method further comprises:

forming a dielectric layer covering the first gate dielectric layer, the first gate conductor, the second gate dielectric layer, and the second gate conductor.

5. The method according to claim 4, further comprising:

forming a first conductive channel extending through the dielectric layer and the source region to the contact region and a second conductive channel extending through the dielectric layer to the second gate conductor in the second trench, wherein a source electrode is connected to the contact region through the first conductive channel and to the second gate conductor in the second trench through the second conductive channel.

6. The method according to claim 5, further comprising:

forming a source electrode above the dielectric layer, wherein the source electrode is connected to the contact region through the first conductive channel and to the second gate conductor in the second trench through the second conductive channel.

7. A trench metal-oxide-semiconductor field effect transistor (MOSFET), comprising:

an epitaxial layer of a first dopant type;

a first trench, extending from an upper surface of the epitaxial layer into the epitaxial layer;

a first shield gate dielectric layer, arranged at a lower part of the first trench and covering an inner surface of the lower part of the first trench;

a first shielding conductor, arranged at the lower part of the first trench and separated from the epitaxial layer by the first shield gate dielectric layer;

a first dielectric interlayer, arranged on a surface of the first shield gate dielectric layer;

a first gate dielectric layer, arranged at an upper part of the first trench and covering an inner surface of the upper part of the first trench;

a first gate conductor, arranged at the upper part of the first trench and separated from the epitaxial layer by the first gate dielectric layer;

a second trench, extending from the upper surface of the epitaxial layer into the epitaxial layer;

a second shield gate dielectric layer, arranged at a lower part of the second trench and covering an inner surface of the lower part of the second trench;

a second shielding conductor, arranged at the lower part of the second trench and separated from the epitaxial layer by the second shield gate dielectric layer;

a second dielectric interlayer, arranged on a surface of the second shield gate dielectric layer;

a second gate dielectric layer, arranged at an upper part of the second trench and covering an inner surface of the upper part of the second trench;

a second gate conductor, arranged at the upper part of the second trench and separated from the epitaxial layer by the second gate dielectric layer;

a body region, a source region, and a contact region, located on two sides in the epitaxial layer adjacent to the first trench and the second trench, wherein the source region is of the first dopant type, and the body region and the contact region are of a second dopant type; and a dielectric constant of the second gate dielectric layer located in the second trench is greater than that of the first gate dielectric layer located in the first trench.

8. The trench MOSFET according to claim 7, wherein the epitaxial layer comprises a first region and a second region, the first trench is located in the first region, and the second trench is located in the second region;

the first gate dielectric layer covers a surface of the first dielectric interlayer inside the first trench, a side wall of the upper part of the first trench, and an upper surface of the epitaxial layer in the first region; and the second gate dielectric layer covers a surface of the second dielectric interlayer inside the second trench, a side wall of the upper part of the second trench, and an upper surface of the epitaxial layer in the second region.

9. The trench MOSFET according to claim 7, further comprising:

a dielectric layer, located above the source region;

a source electrode, located above the dielectric layer;

the contact region of the second dopant type, located in the body region;

a first conductive channel, extending through the dielectric layer and the source region to the contact region; and a second conductive channel, extending through the dielectric layer to the second gate conductor in the second trench, wherein the source electrode is connected to the contact region through the first conductive channel and to the second gate conductor in the second trench through the second conductive channel.

10. The trench MOSFET according to claim 7, further comprising:

a substrate, wherein the epitaxial layer is located on an upper surface of the substrate; and a drain electrode, located on a lower surface of the substrate.

* * * * *